US012758990B2

(12) United States Patent
Kim et al.

(10) Patent No.: US 12,758,990 B2
(45) Date of Patent: Oct. 13, 2026

(54) SUBSTRATE PROCESSING APPARATUS INCLUDING SHOWERHEAD ASSEMBLY

(71) Applicant: SEMES CO., LTD., Cheonan-si (KR)

(72) Inventors: Sung Yeon Kim, Cheonan-si (KR); Ho Ik Kim, Cheonan-si (KR); In Gyu Cho, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 133 days.

(21) Appl. No.: 18/640,150

(22) Filed: Apr. 19, 2024

(65) Prior Publication Data

US 2025/0025896 A1 Jan. 23, 2025

(30) Foreign Application Priority Data

Jul. 21, 2023 (KR) ........................ 10-2023-0095540

(51) Int. Cl.
*B05B 1/18* (2006.01)
*C23C 16/455* (2006.01)

(52) U.S. Cl.
CPC ........ *B05B 1/185* (2013.01); *C23C 16/45565* (2013.01)

(58) Field of Classification Search
CPC ............. H01J 37/3244; H01J 37/32449; H01J 37/32091; H01J 37/32623; C23C 16/45565; H01L 21/67069; B05B 1/005; B05B 1/185
See application file for complete search history.

(56) References Cited

U.S. PATENT DOCUMENTS 5,603,446 A * 2/1997 Kikuchi ............... B23K 20/004 228/6.2
7,270,713 B2 * 9/2007 Blonigan .......... C23C 16/45591 156/345.43
7,942,969 B2 * 5/2011 Riker .................. H01J 37/3244 118/715
8,083,853 B2 * 12/2011 Choi ................... H01J 37/3244 156/345.43
8,147,614 B2 * 4/2012 White ............... H01J 37/32091 156/345.34
8,161,906 B2 * 4/2012 Kadkhodayan ... H01J 37/32568 156/345.43
8,206,506 B2 * 6/2012 Kadkhodayan ... H01J 37/32449 156/345.43

(Continued)

FOREIGN PATENT DOCUMENTS

CN 207188041 U * 4/2018
CN 108464799 A * 8/2018 ............. A47L 15/00

(Continued)

*Primary Examiner* — Craig Kim

(57) ABSTRACT

Proposed is a substrate processing apparatus including a showerhead assembly. A showerhead assembly according to an embodiment includes an upper plate, a gas distribution plate disposed under the upper plate and having a plurality of through-holes, a shower plate disposed under the gas distribution plate and having a plurality of gas spray holes connected to the through-holes, and a fastening unit fastening the gas distribution plate and the shower plate to each other. The fastening unit includes a cam received in the shower plate, and a pinion received in the gas distribution plate. The pinion is coupled to the cam by a rack inserted through a passage formed in the gas distribution plate.

20 Claims, 10 Drawing Sheets

(56) References Cited

U.S. PATENT DOCUMENTS

| | | | | |
|---|---|---|---|---|
| 8,470,127 | B2 * | 6/2013 | de La Llera | H01J 37/32091 156/345.43 |
| 8,519,724 | B2 * | 8/2013 | Kim | G01R 27/2623 156/345.47 |
| 8,557,074 | B2 * | 10/2013 | McCowin | B32B 37/0046 156/169 |
| 8,573,152 | B2 * | 11/2013 | de La Llera | H01R 13/20 156/345.46 |
| 8,702,866 | B2 * | 4/2014 | Augustino | C23C 16/45565 156/345.43 |
| 8,709,162 | B2 * | 4/2014 | Leung | C23C 16/4586 118/724 |
| 9,245,716 | B2 * | 1/2016 | De La Llera | H01J 37/32091 |
| 9,484,190 | B2 * | 11/2016 | Glukhoy | H01J 37/32091 |
| 9,714,465 | B2 * | 7/2017 | Tsuei | C23C 16/45565 |
| 11,130,142 | B2 * | 9/2021 | Lubomirsky | B05B 1/005 |
| 11,692,268 | B2 * | 7/2023 | Choi | C23C 16/4405 239/548 |
| 2002/0046810 | A1 * | 4/2002 | Tanaka | C23C 16/45521 156/345.51 |
| 2004/0163593 | A1 * | 8/2004 | Aota | H01J 37/32174 118/723 E |
| 2005/0173569 | A1 * | 8/2005 | Noorbakhsh | C23C 16/45565 239/690 |
| 2009/0126634 | A1 * | 5/2009 | Yamazawa | H01J 37/32568 118/723 R |
| 2009/0179085 | A1 * | 7/2009 | Carducci | H01J 37/3244 239/289 |
| 2009/0242132 | A1 * | 10/2009 | Sato | H10P 72/0421 156/345.43 |
| 2010/0243609 | A1 * | 9/2010 | Yamazawa | H01J 37/32541 156/345.44 |
| 2011/0042879 | A1 | 2/2011 | Kellogg et al. | |
| 2012/0027918 | A1 | 2/2012 | Tiner et al. | |
| 2016/0013026 | A1 | 1/2016 | Matsuura et al. | |
| 2021/0005419 | A1 * | 1/2021 | Son | H01J 37/20 |
| 2022/0199368 | A1 * | 6/2022 | Son | H01J 37/32211 |
| 2024/0175132 | A1 * | 5/2024 | Paranjpe | C23C 16/4584 |
| 2025/0025896 | A1 * | 1/2025 | Kim | C23C 16/45565 |
| 2025/0051920 | A1 * | 2/2025 | Fukushi | C23C 16/4584 |
| 2025/0183008 | A1 * | 6/2025 | Kim | B05B 1/005 |
| 2025/0326091 | A1 * | 10/2025 | Thompson | B25B 21/00 |

FOREIGN PATENT DOCUMENTS

| | | | | |
|---|---|---|---|---|
| CN | 118726947 A * | 10/2024 | C23C 16/52 |
| CN | 121737423 A * | 3/2026 | |
| KR | 10-1708060 | 1/2011 | |
| KR | 10-1831667 | 10/2013 | |
| KR | 10-2455670 | 1/2016 | |
| KR | 102865277 B1 * | 9/2025 | C23C 16/45544 |
| WO | WO-0150498 A1 * | 7/2001 | H01J 37/32568 |

* cited by examiner

SUBSTRATE PROCESSING APPARATUS INCLUDING SHOWERHEAD ASSEMBLY

CROSS REFERENCE TO RELATED APPLICATION

The present application claims priority to Korean Patent Application No. 10-2023-0095540, filed Jul. 21, 2023, the entire contents of which is incorporated by reference herein for all purposes.

BACKGROUND OF THE INVENTION

Field of the Invention

The present disclosure relates to a substrate processing apparatus including a showerhead assembly and, more particularly, to a showerhead assembly fastened using a cam, a rack, and a pinion.

Description of the Related Art

In the manufacturing process of semiconductor devices and liquid crystal displays, a substrate processing apparatus that performs predetermined processing such as a deposition process, an etching process, and an ashing process is used. The substrate processing apparatus generates plasma in a chamber reduced to a predetermined vacuum pressure and applies this plasma to a substrate, such as a semiconductor wafer or a glass substrate, for a liquid crystal display device.

In general, a showerhead assembly is provided in an apparatus that processes a substrate using plasma. The showerhead assembly receives gas required for the process and sprays it evenly into a processing space inside a chamber.

FIG. 1 is a view schematically illustrating a showerhead assembly.

Referring to FIG. 1, the showerhead assembly 40 may include an upper plate 42, a gas distribution plate 44, and a shower plate 46. The upper plate 42 may be coupled to a chamber 100, the gas distribution plate 44 is disposed under the upper plate 42, and the shower plate 46 may be disposed under the gas distribution plate 44. Gas supplied from a gas supply unit 300 may be supplied to a processing space inside the chamber 100 through the showerhead assembly 40. In the showerhead assembly 40 configured as described above, the upper plate 42, the gas distribution plate 44, and the shower plate 46 may be fastened to each other by fastening bolts 50. During the process using plasma, the shower plate 46 is most exposed to plasma among the components of the showerhead assembly 40, so it needs to be periodically replaced due to degradation.

In order to replace the shower plate 46 in the showerhead assembly 40, the fastening bolts 50 between the chamber 100 and the upper plate 42 and the fastening bolts 50 between the gas distribution plate 44 and the shower plate 46 all need to be unfastened before the shower plate 46 is replaced. This replacement operation is time-consuming, which is not desirable.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide a substrate processing apparatus including a showerhead assembly that is easy to replace.

The objectives of the present disclosure are not limited to those mentioned above, and other objectives not mentioned will be clearly understood by those skilled in the art from the following description.

In order to achieve the above objective, according to one aspect of the present disclosure, there is provided a showerhead assembly, including: an upper plate; a gas distribution plate disposed under the upper plate and having a plurality of through-holes; a shower plate disposed under the gas distribution plate and having a plurality of gas spray holes connected to the through-holes; and a fastening unit fastening the gas distribution plate and the shower plate to each other. The fastening unit may include: a cam received in the shower plate; and a pinion received in the gas distribution plate. The pinion may be coupled to the cam by a rack inserted through a passage formed in the gas distribution plate.

In an embodiment, the pinion may include: a pinion shaft; a pinion gear formed at a first side of the pinion shaft; and a pin formed at a second side of the pinion shaft and passing through the pinion shaft.

In an embodiment, the rack may be in the form of a rack bar on which a rack gear is formed.

In an embodiment, the cam may include: a cylindrical body with an open upper portion; a pair of slits cut diagonally along a circumference of the cylindrical body; and a recess formed at an end of each of the slits.

In an embodiment, the pinion may be rotated by the rack, and the pin formed through the pinion may be moved along the slits of the cam and coupled to the respective recesses.

In an embodiment, the cam may include a plurality of cams provided radially around a center of the shower plate.

In an embodiment, the pinion may include a plurality of pinions provided radially around a center of the gas distribution plate.

In an embodiment, the pinion shaft may include: an elastic member; and a pinion holder fixing the elastic member.

In an embodiment, the gas distribution plate may include: the passage through which the rack is moved.

According to another aspect of the present disclosure, there is provided a substrate processing apparatus, including: a chamber having a processing space therein; a substrate support unit disposed in the processing space and supporting a substrate; a gas supply unit supplying gas required for a process to the processing space; and a showerhead assembly spraying the supplied gas into the processing space. The shower head assembly may include: an upper plate; a gas distribution plate disposed under the upper plate and having a plurality of through-holes; a shower plate disposed under the gas distribution plate and having a plurality of gas spray holes connected to the through-holes; and a fastening unit fastening the gas distribution plate and the shower plate to each other. The fastening unit may include: a cam received in the shower plate; and a pinion received in the gas distribution plate. The pinion may be coupled to the cam by a rack inserted through a passage formed in the gas distribution plate.

In an embodiment, the substrate processing apparatus may further include: a plasma generation unit generating plasma in the processing space.

In an embodiment, the upper plate may be fastened to the chamber using a fastening bolt.

In an embodiment, the pinion may be formed in the gas distribution plate, and the cam may be formed in the shower plate.

In an embodiment, the pinion and the cam may include a plurality of pinions and a plurality of cams provided radially around centers of the gas distribution plate and the shower plate, respectively.

According to another aspect of the present disclosure, there is provided a substrate processing apparatus, including: a chamber having a processing space therein; a substrate support unit disposed in the processing space and supporting a substrate; a gas supply unit supplying gas required for a process to the processing space; and a showerhead assembly spraying the supplied gas into the processing space. The shower head assembly may include: an upper plate; a gas distribution plate disposed under the upper plate and having a plurality of through-holes; a shower plate disposed under the gas distribution plate and having a plurality of gas spray holes connected to the through-holes; and a fastening unit fastening the gas distribution plate and the shower plate to each other. The fastening unit may include: a cam received in the shower plate; and a pinion received in the gas distribution plate. The pinion may be coupled to the cam by a rack inserted through a passage formed in the gas distribution plate, and the cam and the pinion may include a plurality of cams and a plurality of pinions provided radially around centers of the shower plate and the gas distribution plate, respectively.

In an embodiment, the pinion may include: a pinion shaft; a pinion gear formed at a first side of the pinion shaft; and a pin formed at a second side of the pinion shaft and passing through the pinion shaft.

In an embodiment, the pinion shaft may include: an elastic member, and a pinion holder fixing the elastic member.

In an embodiment, the cam may include: a cylindrical body with an open upper portion; a pair of slits cut diagonally along a circumference of the cylindrical body; and a recess formed at an end of each of the slits.

In an embodiment, the rack may be in the form of a rack bar on which a rack gear is formed.

In an embodiment, the pinion may be rotated by the rack, and the pin formed through the pinion may be moved along the slits of the cam and coupled to the respective recesses.

According to the present disclosure, by fastening the showerhead assembly using the cam, the rack, and the pinion, it is possible to reduce the time to replace the shower plate.

In addition, by using the cam, the rack, and the pinion, it is possible to adjust fastening force of the showerhead assembly.

The effects of the present disclosure are not limited to those mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
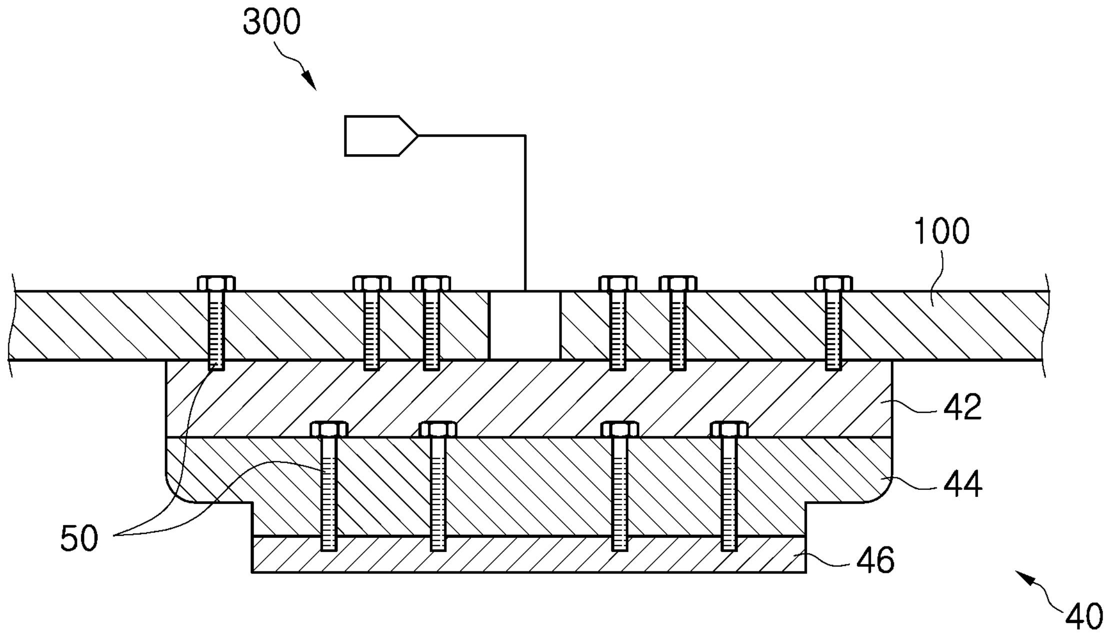
FIG. 1 is a view schematically illustrating a showerhead assembly.

Hereinafter, an exemplary embodiment will be described in detail with reference to the accompanying drawings so that those skilled in the art may easily practice the present disclosure. The embodiment of the present disclosure may be changed to a variety of embodiments and the scope and spirit of the present disclosure are not limited to the embodiment described hereinbelow.

In the following description, it is to be noted that, when the functions of conventional elements and the detailed description of elements related with the present disclosure may make the gist of the present disclosure unclear, a detailed description of those elements will be omitted. Wherever possible, the same reference numerals will be used throughout the drawings and the description to refer to the same or like elements or parts.

Further, technical terms, as will be mentioned hereinafter, are terms defined in consideration of their function in the present disclosure, which may be varied according to the intention of a user, practice, or the like, so that the terms should be defined based on the contents of this specification.

As used herein, the singular forms are intended to include the plural forms as well, unless the context clearly indicates otherwise. Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

In the figures, the size or shape of elements or the thickness of lines may be exaggerated for clarity of illustration.

Hereinafter, the embodiment of the present disclosure will be described in detail with reference to the accompanying drawings, in which identical or similar constituent elements are given the same reference numerals regardless of the reference numerals of the drawings, and repeated description thereof will be omitted.

Figure 2:
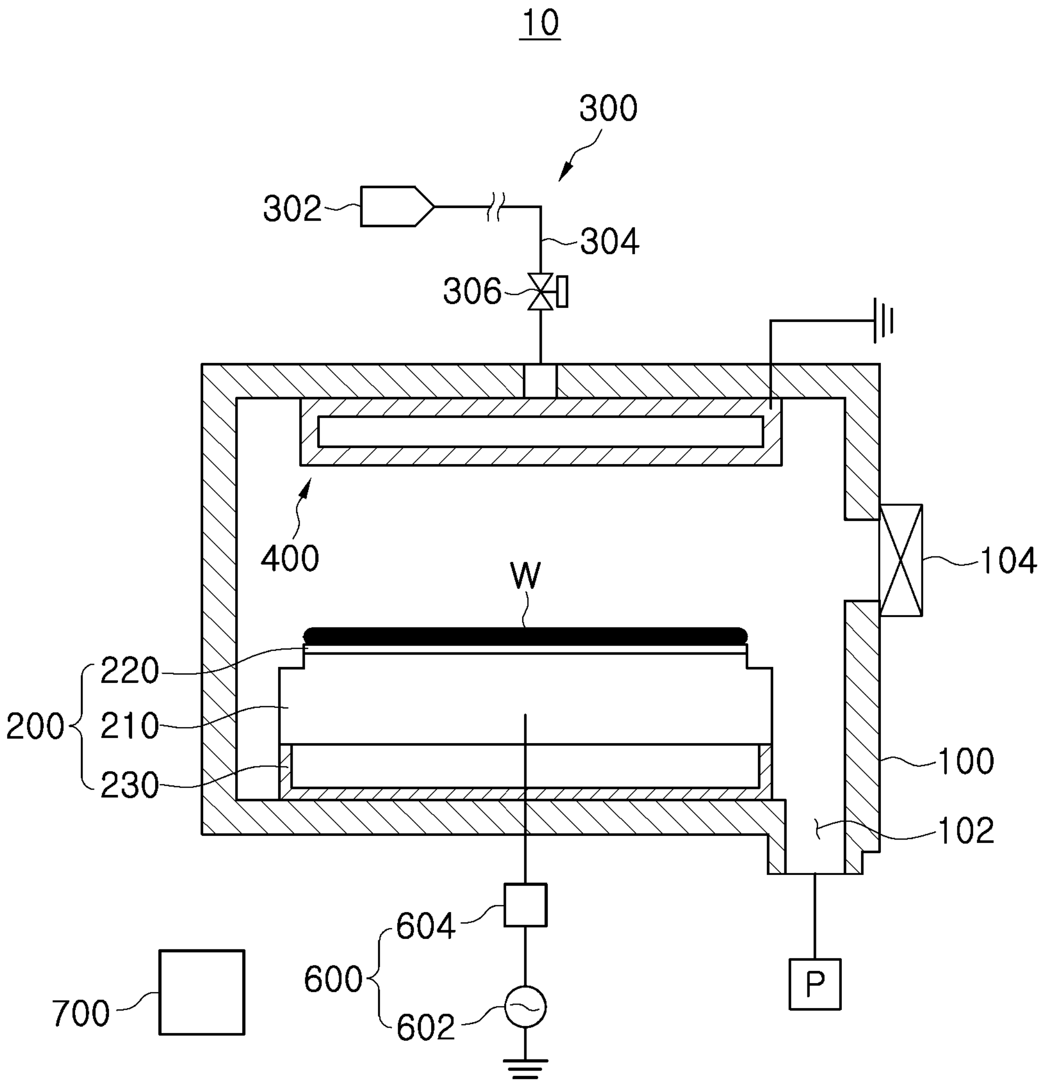
FIG. 2 is a view illustrating a substrate processing apparatus 10 according to an embodiment of the present disclosure.

FIG. 2 is a view illustrating a substrate processing apparatus 10 according to an embodiment of the present disclosure.

Referring to FIG. 2, the substrate processing apparatus 10 is an apparatus that uses plasma, and may include a chamber 100, a substrate support unit 200, a gas supply unit 300, a showerhead assembly 400, and a plasma generation unit 600, and a control unit 700.

The chamber 100 has a processing space where a plasma process is performed. The chamber 100 may have an exhaust port 102 at a lower portion thereof. The exhaust port 102 may be connected to an exhaust line on which a pump P is mounted. The exhaust port 102 may discharge reaction by-products generated during a plasma process and gas remaining inside the chamber 100 to the outside of the chamber 100 through the exhaust line. In this case, the internal space of the chamber 100 may be depressurized to a predetermined pressure.

The chamber 100 may have an opening 104 on a side wall thereof. The opening 104 may function as a passage through which the substrate W enters and exits the chamber 100. The opening 104 may be configured to be opened and closed by a door assembly.

The substrate support unit 200 may be disposed in a lower area inside the chamber 100. The substrate support unit 200 may support the substrate W using electrostatic force. However, the present disclosure is not limited thereto, and the substrate W may be supported by various methods, such as mechanical clamping and vacuum.

The substrate support unit 200 may include a support body 210 and an electrostatic chuck 220 disposed on the support body 210. The electrostatic chuck 220 may be configured to electrostatically adsorb the substrate W, and may include ceramic layers with an electrode interposed therebetween. Although not illustrated, a heating member and a cooling member may be provided inside the substrate support unit 200 to maintain the substrate W at a process temperature during the process. The heating member may be provided as a heating wire, and the cooling member may be provided as a cooling line through which a coolant flows.

A support member 230 may be provided under the support body 210 to support the support body 210 and the electrostatic chuck 220. The support member 230 may have a cylindrical shape with a predetermined height and may have a space therein. The gas supply unit 300 may supply a gas required for the process to the processing space of the chamber 100. The gas supply unit 300 may include a gas source 302, a gas supply line 304, and a gas spray nozzle. The gas supply line 304 may connect the gas source 302 and the gas spray nozzle to each other. A valve 306 may be installed in the gas supply line 304 to open and close a passage of the gas supply line 304 or to control the flow rate of fluid flowing through the passage.

Gas supplied from the gas supply unit 300 may be supplied to the processing space of the chamber 100 through the showerhead assembly 400. The showerhead assembly 400 according to the embodiment of the present disclosure may be made of a material including silicon. The showerhead assembly 400 will be described later.

The plasma generation unit 600 may generate plasma in the processing space of the chamber 100. The plasma may be formed in an upper area of the substrate support unit 200 inside the chamber 100. According to the embodiment of the present disclosure, the plasma generation unit 600 may generate plasma in the processing space inside the chamber 100 using a capacitively coupled plasma (CCP) source.

However, the present disclosure is not limited thereto. The plasma generation unit 600 may generate plasma in the processing space inside the chamber 100 using another type of plasma source, such as an inductively coupled plasma (ICP) source or a microwave.

The plasma generation unit 600 may include a high-frequency power source 602 and a matcher 604. The high-frequency power source 602 may supply high-frequency power to either an upper electrode or a lower electrode to generate a potential difference between the upper electrode and the lower electrode. Here, the upper electrode may be the showerhead assembly 400, and the lower electrode may be the substrate support unit 200. The high-frequency power source 602 may be connected to the lower electrode, and the upper electrode may be grounded.

The control unit 700 may comprehensively control the operation of the substrate processing apparatus 10 configured as described above. The control unit 700 is, for example, a computer and may include a central process unit (CPU), random access memory (RAM), read only memory (ROM), and auxiliary memory. The CPU may operate on the basis of programs or process conditions stored in the ROM or auxiliary memory and control the entire operation of the apparatus 10.

The control unit 700 according to the embodiment of the present disclosure controls gas required for the process to be supplied to the processing space inside the chamber 100 and controls the supplied gas to be converted into plasma by the plasma generation unit 600.

Figure 3:
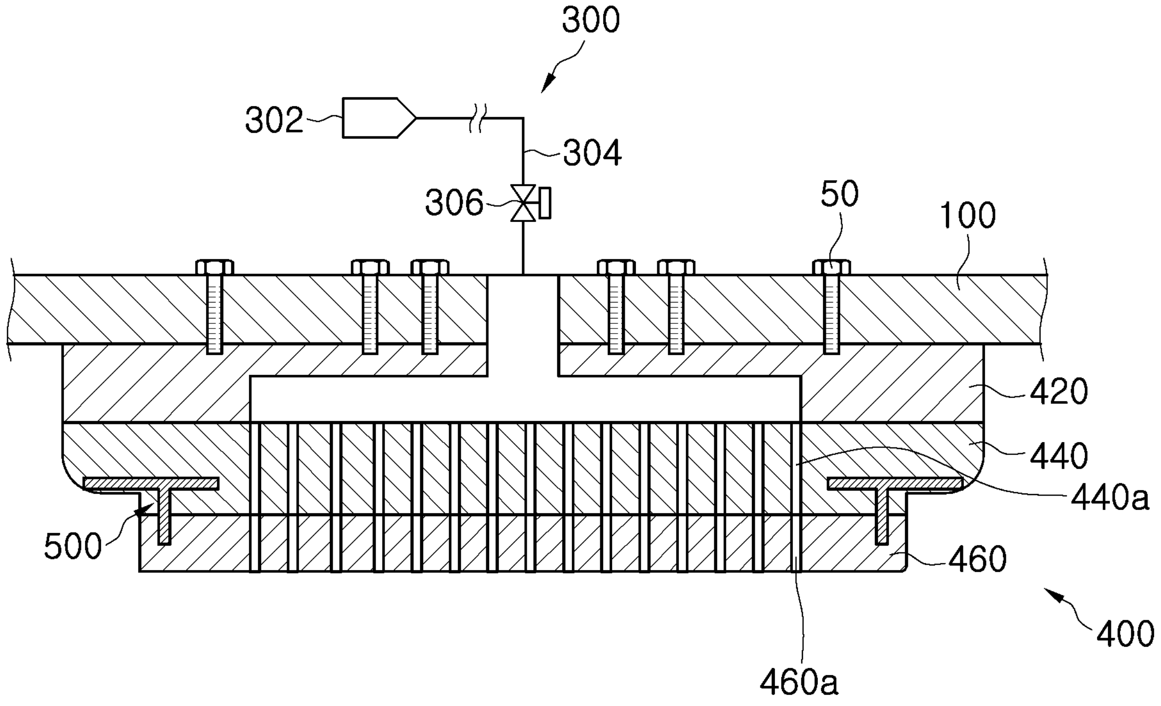
FIG. 3 is a view illustrating a showerhead assembly according to the embodiment of the present disclosure.
Figure 4:
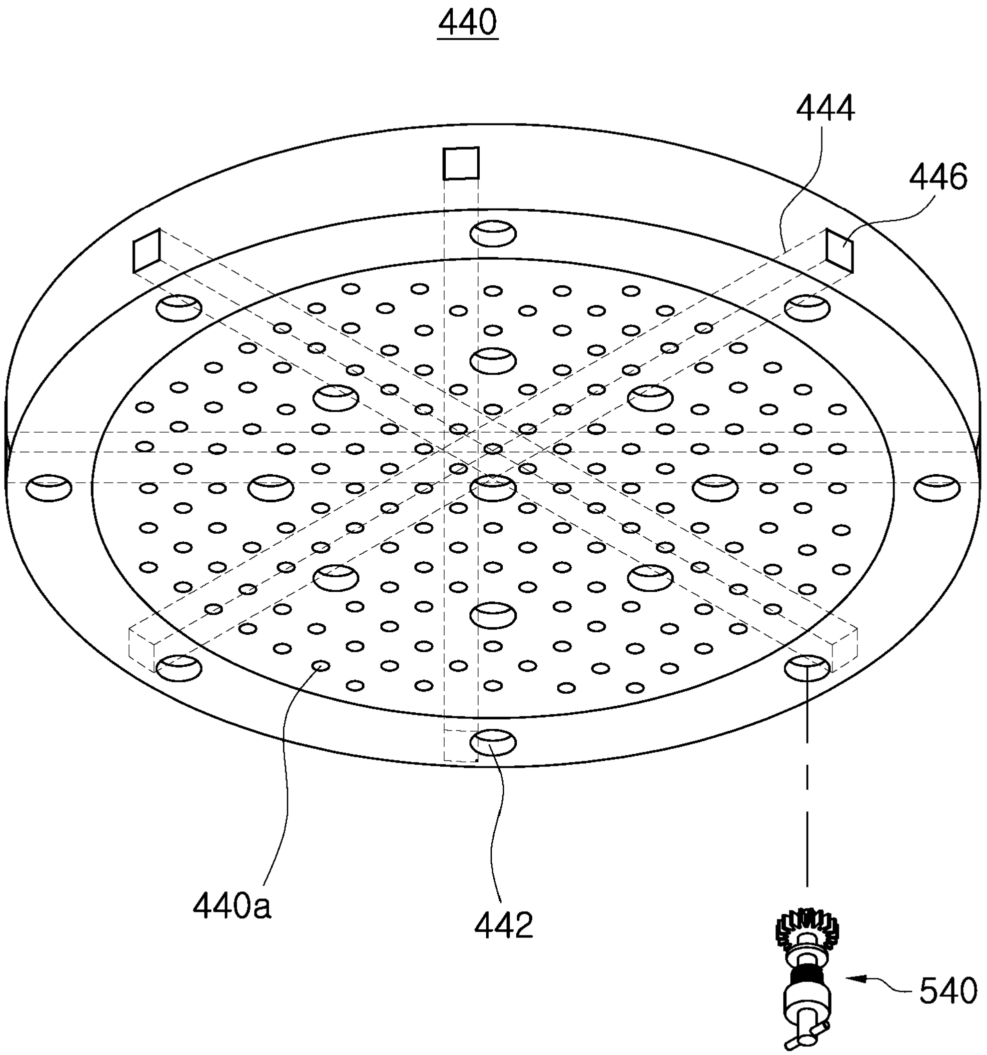
FIG. 4 is a view illustrating a gas distribution plate according to the embodiment of the present disclosure.
Figure 5:
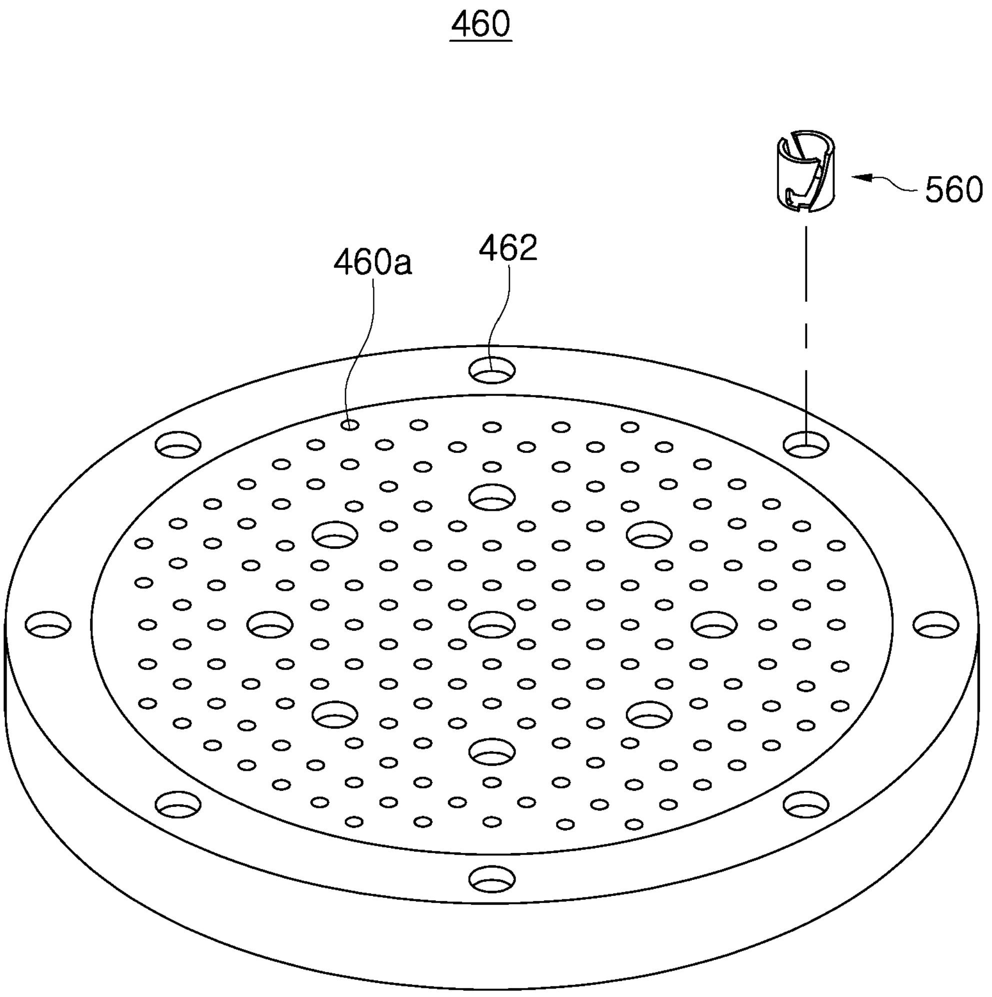
FIG. 5 is a view illustrating a shower plate according to the embodiment of the present disclosure.
Figure 6A:
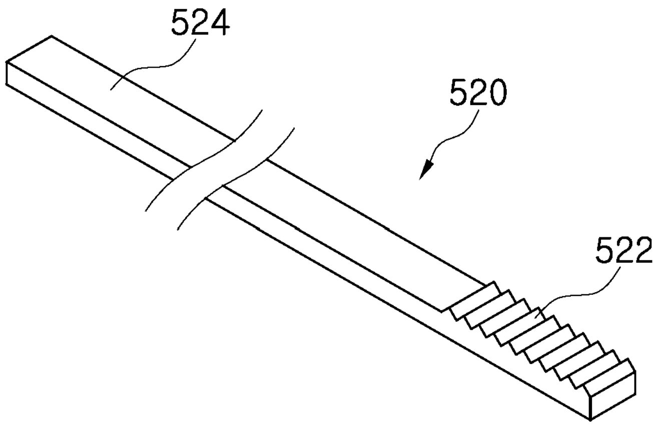
FIGS. 6(*a*), 6(*b*), and 6(*c*) are views illustrating a fastening unit according to the embodiment of the present disclosure.
Figure 6B:
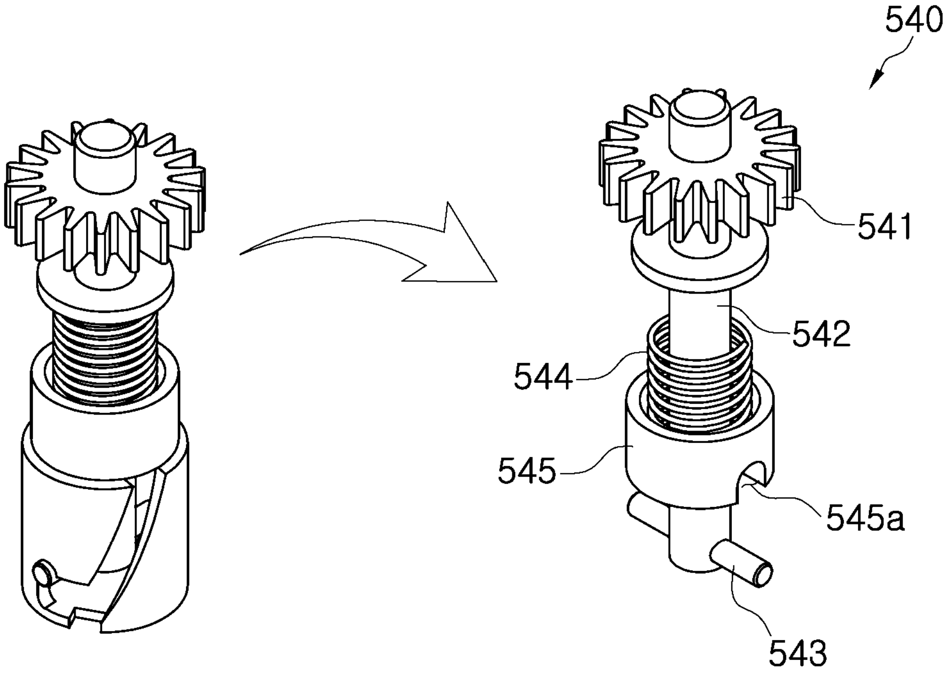
Figure 6C:
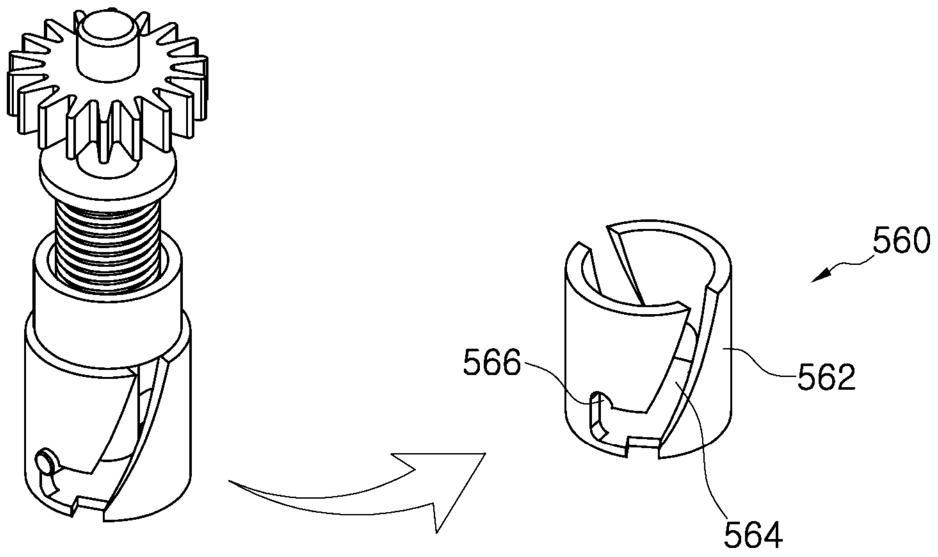
Figure 7A:
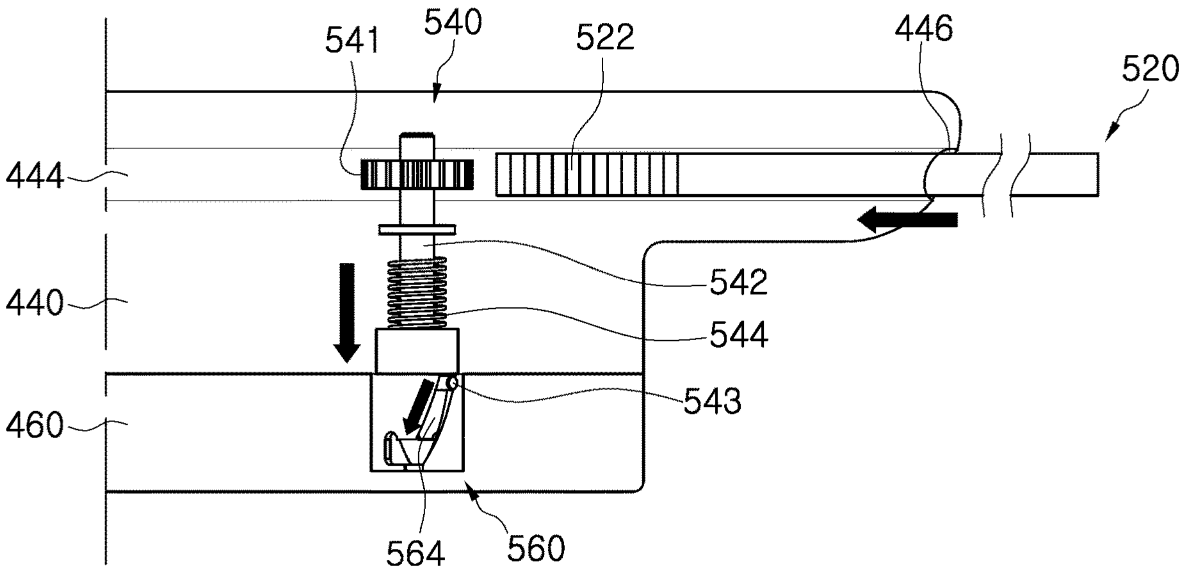
FIGS. 7(*a*) and 7(*b*) are views illustrating a fastening mechanism of the fastening unit 500 according to the embodiment of the present disclosure.
Figure 7B:
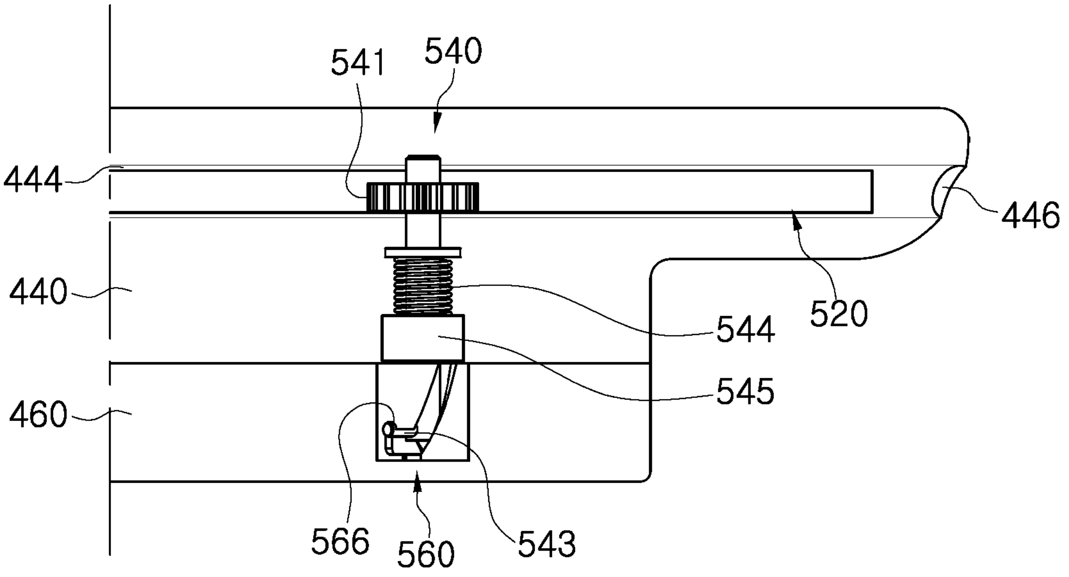

FIGS. 3 to 7(*b*) are views illustrating the showerhead assembly 400 according to the embodiment of the present disclosure. FIG. 3 is a sectional view illustrating the showerhead assembly 400. FIG. 4 is a view illustrating a gas distribution plate 440. FIG. 5 is a view illustrating a shower plate 460. FIGS. 6(*a*), 6(*b*), and 6(*c*) are views illustrating a fastening unit 500 applied to the showerhead assembly 400. FIGS. 7(*a*) and 7(*b*) are views illustrating a fastening mechanism of the fastening unit 500.

Referring to FIG. 3, the showerhead assembly 400 may include an upper plate 420, the gas distribution plate 440, the shower plate 460, and the fastening unit 500.

The upper plate 420 may be installed in close contact with an upper surface of the chamber 100. The upper plate 420 according to the embodiment of the present disclosure may be fastened to the chamber 100 using fastening bolts 50. The upper plate 420 may have a predetermined space therein so that gas supplied from the gas supply unit 300 is supplied to the gas distribution plate 440 and the shower plate 460.

The gas distribution plate 440 may be disposed under the upper plate 420, and may be installed in close contact with a lower surface of the upper plate 420. Here, although not illustrated, the gas distribution plate 440 may be fastened to the upper plate 420 using fastening member, but the present disclosure is not limited thereto. The gas distribution plate 440 may have a plurality of through-holes 440*a*.

FIG. 4 is a view illustrating a lower surface of the gas distribution plate 440, illustrating a surface fastened to the shower plate 460. Referring to FIG. 4, the gas distribution plate 440 according to the embodiment of the present disclosure may have a receiving hole 442 in which a pinion 540, which will be described later, is received. A plurality of receiving holes 442 may be provided radially around the center of the gas distribution plate 440. According to the embodiment of the present disclosure, the gas distribution plate 440 may be provided with a pinion gear 541, a pinion shaft 542, an elastic member 544, and a pinion holder 545, and a pin 543 may be provided to protrude from the gas distribution plate 440. In addition, the gas distribution plate 440 may include a passage 444 through which a rack 520, which will be described later, is moved. The passage 444 may have a size slightly larger than the size of the rack 520. An opening 446 connected to the passage 444 may be formed on an outer peripheral surface of the gas distribution plate 440.

The shower plate 460 may be disposed under the gas distribution plate 440. The shower plate 460 may have a circular plate shape. The shower plate 460 may have a plurality of gas spray holes 460*a* connected to the through-holes 440*a* formed in the gas distribution plate 440.

FIG. 5 is a view illustrating an upper surface of the shower plate 460, illustrating a surface fastened to the gas distribution plate 440. Referring to FIG. 4, the shower plate 460 according to the embodiment of the present disclosure may have a receiving hole 462 in which a cam 560, which will be described later, is received (i.e., accommodated). A plurality of receiving holes 462 may be provided radially around the center of the shower plate 460.

The gas distribution plate 440 and the shower plate 460 according to the embodiment of the present disclosure may be fastened using the fastening unit 500. The fastening unit 500 according to the embodiment of the present disclosure may include the rack 520, the pinion 540, and the cam 560.

FIG. 6(*a*) illustrates the rack 520. The rack 520 may be in the form of a rack bar 524 on which a rack gear 522 is formed. The rack gear 522 may be formed on a part of the rack bar 524 or on a front surface of the rack bar 524. The rack 520 according to the embodiment of the present disclosure may be inserted into the opening 446 formed on the outer peripheral surface of the gas distribution plate 440 and may be moved along the passage 444 inside the gas distribution plate 440. When the rack 520 is fully inserted into the gas distribution plate 440, a cap for fixing the rack 520 may be inserted into the opening 446 of the gas distribution plate 440.

FIG. 6(*b*) illustrates the pinion 540. The pinion 540 may include the pinion gear 541, the pinion shaft 542, the pin 543, the elastic member 544, and the pinion holder 545. The pinion gear 541 may be provided at a first side of the pinion shaft 542, and the pin 543 passing through the pinion shaft 542 may be provided at a second side of the pinion shaft 542. The elastic member 544 may be provided on the pinion shaft 542. The elastic member 544 according to the embodiment of the present disclosure is a spring, but the present disclosure is not limited thereto. According to the present disclosure, the pinion gear 541, the pinion shaft 542, and the elastic member 544 may be received in (i.e., accommodated in) the receiving hole 442 of the gas distribution plate 440, and the elastic member 544 may be fixed by the pinion holder 545. In the present disclosure, although the elastic member 544 and the pinion holder 545 are illustrated separately, the present disclosure is not limited thereto, and the elastic member 544 and the pinion holder 545 may be provided as an integrated body. In addition, a hole 545*a* into which the pin 543 is inserted may be formed in the pinion holder 545, but the present disclosure is not limited thereto. As the pinion gear 541 is rotated, rotational force is provided to the pinion shaft 542, and thereby the pin 543 formed through the pinion shaft 542 may also be rotated. The size and shape of the pinion 540 may be changed. For example, the pinion gear 541 may have various shapes, such as circular or semicircular, as needed.

FIG. 6(*c*) illustrates the cam 560. The cam 560 has a cylindrical body 562 with an open upper surface, and may include a pair of slits 564 cut diagonally along the circumference of the cylindrical body 562 from the open surface. A recess 566 may be formed at an end of each of the slits 564. The size of the cam 560 may be changed.

FIGS. 7(*a*) and 7(*b*) are views illustrating a fastening mechanism of the fastening unit 500 according to the embodiment of the present disclosure. Referring to FIG. 7(*a*), as described above, since the pin 543 of the pinion 540 protrudes from the gas distribution plate 440, the pin 543 may be provided in a state of being coupled to upper ends of the slits 564 formed in the cam 560 of the shower plate 460. When the rack 520 is introduced into the opening 446 formed on the outer peripheral surface of the gas distribution plate 440, the rack gear 522 and the pinion gear 541 of the rack 520 may be engaged and rotated. As illustrated in FIG. 7(*b*), as the pinion gear 541 is rotated by the rack gear 522, the elastic member 544 formed on the pinion shaft 542 may be compressed and fixed by the pinion holder 545. The pin 543 formed through the pinion shaft 542 may be moved along the slits 564 formed in the cam 560 and coupled to the respective recesses 566. In this process, the rack 520 may be fully inserted into the passage 444 formed inside the gas distribution plate 440.

As in the embodiment of the present disclosure, when a plurality of pinions 540 are provided radially at the gas distribution plate 440, each pinion gear 541 may be rotated by inserting the rack 520 into the opening 446 connected to the passage 444 formed inside the gas distribution plate 440. With this, one or several pinions 540 may be engaged to or disengaged from one or several cams 560 simultaneously, thereby shortening the time required to replace the shower plate 460.

According to the present disclosure, fastening force between the gas distribution plate 440 and the shower plate 460 may be adjusted depending on the size and shape of the pinion 540, the type of the elastic member 544, and the size of the cam 560. In more detail, fastening force between the gas distribution plate 440 and the shower plate 460 may be adjusted depending on the number of revolutions of the pinion gear 541, the type of the elastic member 544, and the length of the slits 564 formed in the cam 560 to which the pin 543 formed through the pinion shaft 542 is coupled.

As described above, the gas distribution plate and the shower plate of the showerhead assembly may be fastened to each other using the cam, the rack, and the pinion. In more detail, the cam may be provided in the shower plate, and the pinion may be provided in the gas distribution plate. The pinion may be coupled to the cam by the rack inserted through the passage formed in the gas distribution plate. With this, the shower plate may be replaced by only releasing the coupling between the gas distribution plate and the shower plate without unfastening the fastening bolts connected between the upper plate and the chamber, thereby shortening the time to replace the shower plate.

In addition, a plurality of pinions and a plurality of cams are provided radially around the centers of the gas distribution plate and the shower plate, respectively. Therefore, one or several pinions may be engaged to or disengaged from one or several cams, thereby shortening the time required to replace the shower plate. In addition, when the gas distribution plate and the shower plate are fastened to each other, fastening force may be adjusted depending on the size and shape of the pinion gear of the pinion, the type of the elastic member, and the size of the cylindrical body of the cam.

Although the exemplary embodiment of the present disclosure has been described for illustrative purposes, those skilled in the art will appreciate that various modifications, additions, and substitutions are possible, without departing from the scope and spirit of the present disclosure. Therefore, the exemplary embodiment of the present disclosure has not been described for limiting purposes, and the scope of the disclosure is not to be limited by the above embodiment. The scope of the present disclosure should be determined on the basis of the descriptions in the appended claims, and all equivalents thereof should belong to the scope of the present disclosure.

What is claimed is:

1. A showerhead assembly, comprising:
an upper plate;
a gas distribution plate disposed under the upper plate and having a plurality of through-holes;
a shower plate disposed under the gas distribution plate and having a plurality of gas spray holes connected to the plurality of through-holes; and
a fastening unit fastening the gas distribution plate and the shower plate to each other,
wherein the fastening unit comprises:
a cam received by a receiving hole of the shower plate; and
a pinion received by a receiving hole of the gas distribution plate, and
wherein the pinion is coupled to the cam by a rack inserted through a passage formed in the gas distribution plate.

2. The showerhead assembly of claim 1,
wherein the pinion comprises:
a pinion shaft;
a pinion gear formed at a first side of the pinion shaft; and
a pin formed at a second side of the pinion shaft and passing through the pinion shaft.

3. The showerhead assembly of claim 1,
wherein the rack is in the form of a rack bar on which a rack gear is formed.

4. The showerhead assembly of claim 2,
wherein the cam comprises:
a cylindrical body with an open upper portion;
a pair of slits cut diagonally along a circumference of the cylindrical body; and
a recess formed at an end of each of the slits.

5. The showerhead assembly of claim 4,
wherein the pinion is rotated by the rack, and
wherein the pin is moved along the slits of the cam and coupled to the respective recesses.

6. The showerhead assembly of claim 1,
wherein the cam comprises a plurality of cams provided radially around a center of the shower plate.

7. The showerhead assembly of claim 1,
wherein the pinion comprises a plurality of pinions provided radially around a center of the gas distribution plate.

8. The showerhead assembly of claim 2,
wherein the pinion shaft comprises:
an elastic member; and
a pinion holder fixing the elastic member.

9. The showerhead assembly of claim 1,
wherein the gas distribution plate comprises:
the passage through which the rack is moved.

10. A substrate processing apparatus, comprising:
a chamber having a processing space therein;
a substrate support unit disposed in the processing space and supporting a substrate;
a gas supply unit supplying gas required for a process to the processing space; and
a showerhead assembly spraying the supplied gas into the processing space,
wherein the showerhead assembly comprises:
an upper plate;
a gas distribution plate disposed under the upper plate and having a plurality of through-holes;
a shower plate disposed under the gas distribution plate and having a plurality of gas spray holes connected to the plurality of through-holes; and
a fastening unit fastening the gas distribution plate and the shower plate to each other,
wherein the fastening unit comprises:
a cam accommodated by a receiving hole of the shower plate; and
a pinion accommodated by a receiving hole of the gas distribution plate, and
wherein the pinion is coupled to the cam by a rack inserted through a passage formed in the gas distribution plate.

11. The substrate processing apparatus of claim 10, further comprising:
a plasma generation unit generating plasma in the processing space.

12. The substrate processing apparatus of claim 10,
wherein the upper plate is fastened to the chamber using a fastening bolt.

13. The substrate processing apparatus of claim 10,
wherein the pinion is formed in the gas distribution plate, and
wherein the cam is formed in the shower plate.

14. The substrate processing apparatus of claim 13,
wherein the pinion and the cam comprise a plurality of pinions and a plurality of cams provided radially around centers of the gas distribution plate and the shower plate, respectively.

15. A substrate processing apparatus, comprising:
a chamber having a processing space therein;
a substrate support unit disposed in the processing space and supporting a substrate;
a gas supply unit supplying gas required for a process to the processing space; and
a showerhead assembly spraying the supplied gas into the processing space,
wherein the showerhead assembly comprises:
an upper plate;
a gas distribution plate disposed under the upper plate and having a plurality of through-holes;
a shower plate disposed under the gas distribution plate and having a plurality of gas spray holes connected to the plurality of through-holes; and
a fastening unit fastening the gas distribution plate and the shower plate to each other,
wherein the fastening unit comprises:
a cam received by a receiving hole of the shower plate; and
a pinion received by a receiving hole of the gas distribution plate,
wherein the pinion is coupled to the cam by a rack inserted through a passage formed in the gas distribution plate, and
wherein the cam and the pinion comprise a plurality of cams and a plurality of pinions provided radially around centers of the shower plate and the gas distribution plate, respectively.

16. The substrate processing apparatus of claim 15,
wherein the pinion comprises:
a pinion shaft;
a pinion gear formed at a first side of the pinion shaft; and
a pin formed at a second side of the pinion shaft and passing through the pinion shaft.

17. The substrate processing apparatus of claim 16,
wherein the pinion shaft comprises:
an elastic member; and
a pinion holder fixing the elastic member.

18. The substrate processing apparatus of claim 16, wherein the cam comprises:

a cylindrical body with an open upper portion;

a pair of slits cut diagonally along a circumference of the cylindrical body; and a recess formed at an end of each of the slits.

19. The substrate processing apparatus of claim 15, wherein the rack is in the form of a rack bar on which a rack gear is formed.

20. The substrate processing apparatus of claim 18, wherein the pinion is rotated by the rack, and wherein the pin is moved along the slits of the cam and coupled to the respective recesses.

* * * * *